United States Patent
Wang et al.

(10) Patent No.: US 12,021,169 B2
(45) Date of Patent: Jun. 25, 2024

(54) COMPOSITE SUBSTRATE, METHOD FOR MANUFACTURING THE SAME AND METHOD FOR MANUFACTURING LIGHT-EMITTING DEVICE USING THE SAME

(71) Applicant: ANHUI SANAN OPTOELECTRONICS CO., LTD., Wuhu (CN)

(72) Inventors: Yu Wang, Wuhu (CN); Chiahao Tsai, Wuhu (CN); Qin Wang, Wuhu (CN); Bin Fang, Wuhu (CN); Liangliang Gui, Wuhu (CN); Jinkuang Dong, Wuhu (CN); Shan Wang, Wuhu (CN); Zhaoming Huang, Wuhu (CN); Chih-Chung Chiu, Wuhu (CN); Chi-ming Tsai, Wuhu (CN)

(73) Assignee: Anhui Sanan Optoelectronics Co., Ltd., Anhui (CN)

( * ) Notice: Subject to any disclaimer, the term of this patent is extended or adjusted under 35 U.S.C. 154(b) by 526 days.

(21) Appl. No.: 17/338,901

(22) Filed: Jun. 4, 2021

(65) Prior Publication Data

US 2021/0296535 A1  Sep. 23, 2021

Related U.S. Application Data

(63) Continuation-in-part of application No. PCT/CN2020/075618, filed on Feb. 18, 2020.

(30) Foreign Application Priority Data

Mar. 22, 2019 (CN) .......................... 201910221205.5

(51) Int. Cl.
*H01L 21/02* (2006.01)
*H01L 33/00* (2010.01)
(Continued)

(52) U.S. Cl.
CPC .......... *H01L 33/32* (2013.01); *H01L 33/0075* (2013.01); *H01L 33/0095* (2013.01);
(Continued)

(58) Field of Classification Search
CPC . H01L 33/32; H01L 33/0075; H01L 33/0095; H01L 33/04; H01L 33/22;
(Continued)

(56) References Cited

U.S. PATENT DOCUMENTS

| | | | | |
|---|---|---|---|---|
| 2012/0126259 | A1* | 5/2012 | Mizutani | H01L 27/156 257/E33.012 |
| 2015/0144968 | A1* | 5/2015 | Herner | H01L 33/0095 438/33 |

FOREIGN PATENT DOCUMENTS

| | | | | |
|---|---|---|---|---|
| CN | 106848029 | A * | 6/2017 | ............. H01L 21/78 |
| CN | 107408364 | A * | 11/2017 | .......... F21V 19/0015 |

\* cited by examiner

*Primary Examiner* — Samuel Park
(74) *Attorney, Agent, or Firm* — Thomas | Horstemeyer, LLP

(57) ABSTRACT

The disclosure illustrates a composite substrate and a method for manufacturing the same, the method including: disposing a mask layer on an upper surface of a substrate; forming a plurality of mask patterns spaced apart from each other to form a plurality of intervals thereamong; filling a dummy metallic material into the intervals; removing the mask patterns to form a mesh-like dummy metallic layer; and removing the dummy metallic layer while depositing a nitride layer so as to form a mesh-like structure confined by the nitride layer and the substrate. The disclosure also illustrates a method for manufacturing a light-emitting device using the composite substrate.

14 Claims, 5 Drawing Sheets

(51) Int. Cl.
  *H01L 33/04*   (2010.01)
  *H01L 33/22*   (2010.01)
  *H01L 33/32*   (2010.01)
  *H01L 33/38*   (2010.01)

(52) U.S. Cl.
  CPC .............. *H01L 33/04* (2013.01); *H01L 33/22* (2013.01); *H01L 33/382* (2013.01); *H01L 2933/0016* (2013.01)

(58) Field of Classification Search
  CPC ........... H01L 33/382; H01L 2933/0016; H01L 33/20; H01L 21/00; H01L 33/007; H01L 33/02
  See application file for complete search history.

COMPOSITE SUBSTRATE, METHOD FOR MANUFACTURING THE SAME AND METHOD FOR MANUFACTURING LIGHT-EMITTING DEVICE USING THE SAME

CROSS-REFERENCE TO RELATED APPLICATION

This application is a continuation-in-part (CIP) application of International Application No. PCT/CN2020/075618, filed on Feb. 18, 2020, which claims priority of Chinese Invention Patent Application No. 201910221205.5, filed on Mar. 22, 2019.

FIELD

The disclosure relates to a technical field of semiconductor materials, and more particularly to a composite substrate, a method for manufacturing the same, and a method for manufacturing a light-emitting device using the same.

BACKGROUND

Semiconductor light-emitting devices have been widely used in various applications, such as tube lights, bulbs, indoor and outdoor display screens with various sizes and designs, TV backlights, mobile phone backlights, indicators for domestic appliances and automotive lighting, etc., owing to high brightness, low drive voltage, low power consumption, long lifetime, etc.

However, a process for manufacturing the semiconductor light-emitting devices, such as light-emitting diodes (LEDs), involves forming individual light-emitting dies by laser cutting. The laser cutting involves a stealth dicing process which includes the steps of: focusing a laser beam on an interior of a wafer from a backside of a substrate where the wafer is translucent to the laser beam; forming a modified layer at a specific depth of the substrate for dicing; and expanding a dicing tape to separate the wafer into dies. During the stealth dicing process, due to difference in thickness between a wafer center and a wafer edge caused by wafer warpage, a boundary region of an epitaxial layer of the dies especially located at the wafer edge has a relatively thin thickness. Due to difficulty in controlling laser energy, the boundary region of the epitaxial layer of the dies tends to be damaged due to overloaded laser energy, resulting in current leakage in the light-emitting devices, which adversely affects the light-emitting performance thereof.

SUMMARY

Therefore, an object of the disclosure is to provide a composite substrate that can alleviate or eliminate at least one of the drawbacks of the prior art.

According to a first aspect of the disclosure, a method for manufacturing a composite substrate includes: disposing a mask layer on an upper surface of a substrate; forming a plurality of mask patterns spaced apart from each other to form a plurality of intervals thereamong; filling a dummy metallic material into the intervals; removing the mask patterns to form a mesh-like dummy metallic layer; and removing the dummy metallic layer while depositing a nitride layer so as to form a mesh-like structure confined by the nitride layer and the substrate.

According to a second aspect of the disclosure, a composite substrate includes: a substrate; a nitride layer disposed on the substrate; and a mesh-like structure confined by the nitride layer and the substrate. The mesh-like structure divides the substrate into a plurality of regions.

According to a third aspect of the disclosure, a method for manufacturing a light-emitting device, includes: disposing a light-emitting epitaxial layer on the nitride layer of the composite substrate as mentioned above, the light-emitting epitaxial layer including a first semiconductor layer, a second semiconductor layer and a multi-quantum-well structure that is disposed between the first semiconductor layer and the second semiconductor layer; forming a plurality of mesas spaced apart from each other on the light-emitting epitaxial layer so as to form a plurality of gaps thereamong; and forming a plurality of light-emitting dies by cutting the composite substrate and the light-emitting epitaxial layer along the mesh-like structure and the gaps.

According to a fourth aspect of the disclosure, a light-emitting device made by the abovementioned method includes: a substrate; a nitride layer, a second semiconductor layer, a multi-quantum-well structure and a first semiconductor layer, which are sequentially disposed on the substrate in such order; a first electrode disposed on the first semiconductor layer; a second electrode disposed on the second semiconductor layer; and a depressed area formed in a boundary region between the nitride layer and the substrate.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1A:
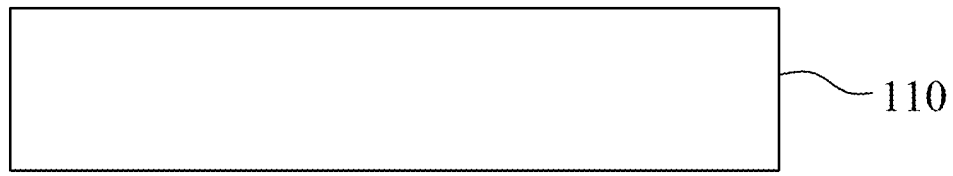
FIGS. 1A to 1F are schematic views illustrating consecutive steps of a method for manufacturing a composite substrate in accordance with an embodiment of the disclosure.

Before the disclosure is described in greater detail, it should be noted that where considered appropriate, reference numerals or terminal portions of reference numerals have been repeated among the figures indicate corresponding or analogous elements, which may optionally have similar characteristics.

Figure 1B:
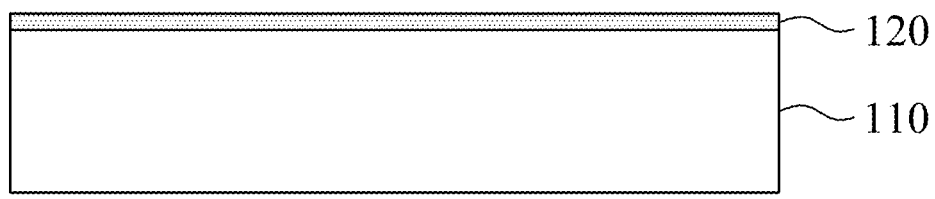
Figure 1C:
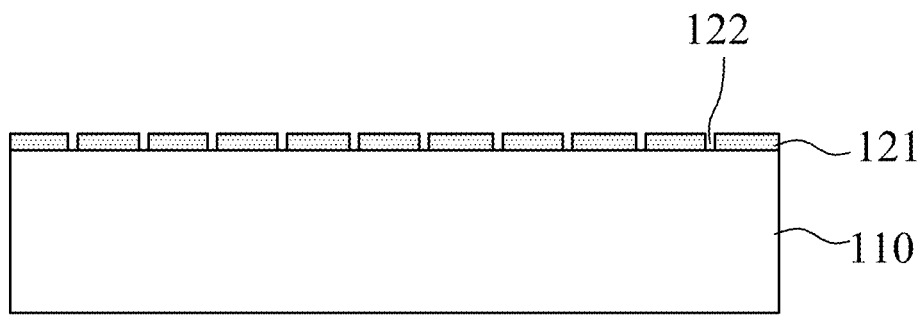
Figure 1D:
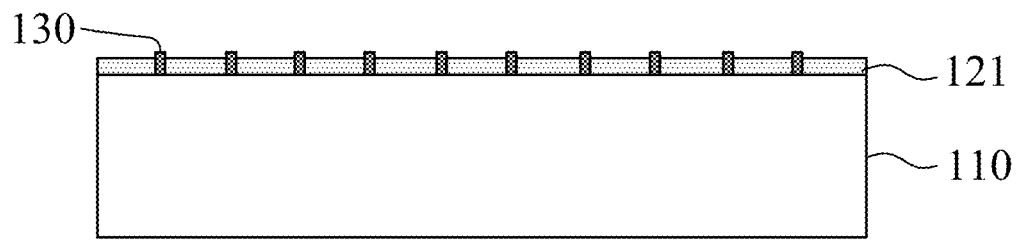
Figure 1E:
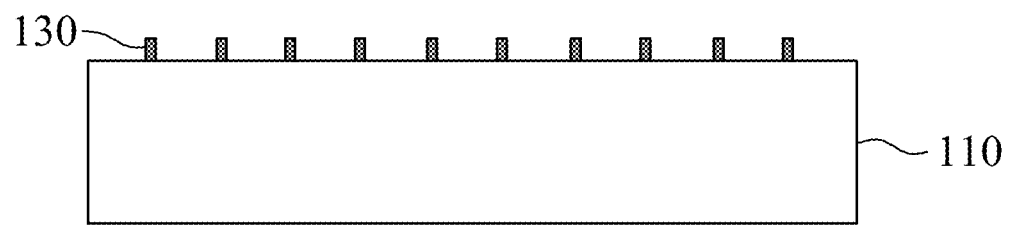
Figure 1F:
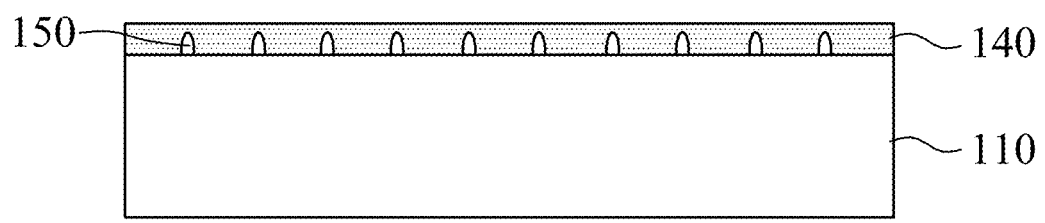

Referring to FIGS. 1A to 1F, a method for manufacturing a composite substrate in accordance with an embodiment of the disclosure at least includes:

step S1 of providing a substrate 110 which at least has an upper surface suitable for an epitaxial growth (as shown in FIG. 1A);

step S2 of disposing a mask layer 120 on the upper surface of the substrate 110 (as shown in FIG. 1B);

step S3 of forming a plurality of mask patterns 121 spaced apart from each other to form a plurality of intervals 122 thereamong, the intervals 122 serving as a pre-filling area (as shown in FIG. 1C);

step S4 of filling a dummy metallic material into the pre-filling area to form a dummy metallic layer 130 (as shown in FIG. 1D);

step S5 of removing the mask patterns 121 to form the mesh-like dummy metallic layer 130 on the substrate 110 (as shown in FIG. 1E); and step S6 of removing the dummy metallic layer 130 while depositing a nitride layer 140 so as to form a mesh-like structure 150 confined by the nitride layer 140 and the substrate 110 (as shown in FIG. 1F). The mesh-like structure 150 serves as first pre-cutting channels for a wafer dicing process to be subsequently performed when the composite substrate thus formed is used for making a wafer.

In step S1, the substrate 110 is a patterned substrate or a plane substrate. Materials for making the substrate 110 are selected from the group consisting of sapphire, silicon, silicon carbide or gallium nitride, but not limited thereto. A diameter of the substrate 110 ranges from 2 inches to 12 inches. The method for manufacturing a composite substrate of the disclosure is more suitable for large-sized substrates. In the embodiment, the substrate 110 is a plane sapphire substrate having a diameter of 4 inches. In practice, the larger the substrate 110 is, the more effective chips prepared are, which reduces manufacturing cost of the composite substrate and light-emitting devices.

In step S2, the mask layer 120 is made of a photoresist or a hard mask that is made of a material such as silicon oxide, silicon nitride and silicon carbide, etc., but not limited thereto.

In step S3, the mask patterns 121 spaced apart from each other are formed by photolithography. Sizes and shapes of the mask patterns 121 are correlated to those of targeted chips intended to be fabricated. In the embodiment, the size and the shape of the mask patterns 121 are basically the same as those of the light-emitting devices intended to be fabricated. The mask patterns 121 have a height (measured from the upper surface of the substrate 110) ranging from 3 μm to 5 μm. Preferably, the height of the mask patterns is 3.8 μm. The intervals 122 among the mask patterns 121 have a width ranging from 14 μm to 28 μm.

In step S4, the dummy metallic material is selected from a metal or a metal compound, such as magnesium (Mg), sodium, zinc or magnesium nitride. In the embodiment, the dummy metallic layer is made of magnesium having a melting point of about 648° C. so that a uniform magnesium layer having a thickness that ranges from 3 μm to 5 μm can be formed on the substrate 110 by filling magnesium into the intervals 122 through evaporative physical vapor deposition (PVD).

Further, magnesium has a relatively lower boiling point (i.e., about 1108° ° C.) compared with other metals or metal compounds, and hence, the vaporization condition of magnesium can be satisfied by a temperature range of a reaction chamber used in metal-organic chemical vapor deposition (MOCVD) technology so that the mesh-like structure 150 can be formed along with deposition of the nitride layer 140. In addition, magnesium is one of essential p-type dopants for a light-emitting epitaxial layer, and thus, Mg vapor is useful as a p-type dopant during deposition of the nitride layer 140, rather than being a pollutant.

In step S6, deposition of the nitride layer 140 on the substrate 110 with the mesh-like dummy metallic layer 130 thereon may be carried out using one of MOCVD, PVD and plasma-enhanced chemical vapor deposition (PECVD) techniques. The technique used for the deposition of the nitride layer 140 may be the same as that used for a deposition of an epitaxial layer to be subsequently performed. For example, the nitride layer 140 is made of a group IIIA nitride material including gallium nitride (GaN), aluminum nitride (AlN), aluminum gallium nitride (AlGaN) and combinations thereof. Besides, the nitride layer 140 is deposited at a temperature higher than a removal temperature of the dummy metallic layer 130, so that the mesh-like dummy metallic layer 130 is gradually vaporized along with the deposition of the nitride layer 140, so as to form the mesh-like structure 150 within the nitride layer 140. Preferably, the mesh-like structure 150 has a plurality of holes arranged in an array, i.e., the mesh-like structure 150 exhibits a crisscross pattern. In the embodiment, the nitride layer 140 is made of GaN, and is deposited using MOCVD technique. Because of a difference of diffusion coefficient between Mg and GaN, the composite substrate having the mesh-like structure 150 with the specific pattern is formed by mutual diffusion of Mg and GaN, and vaporization of Mg. A portion of Mg vapor thus formed is exhausted through a venting unit of an MOCVD equipment, while a remainder portion of Mg vapor not exhausted in time is deposited on a chamber wall of the MOCVD equipment. Mg deposited on the chamber wall is useful as a strong catalyst for an epitaxial growth of GaN through MOCVD. Therefore, the method for manufacturing the composite substrate of this disclosure has an advantage of not polluting the chambers used in MOCVD, PVD and PECVD techniques.

Referring to FIG. 1F, the composite substrate thus formed includes the substrate 110, the nitride layer 140 disposed on the substrate 110, and the mesh-like structure 150 confined by the nitride layer 140 and the substrate 110. The mesh-like structure 150, which has a width ranging from 14 μm to 28 μm and a height ranging from ranging from 3 μm to 5 μm, divides the substrate 110 into a plurality of regions.

Figure 2:
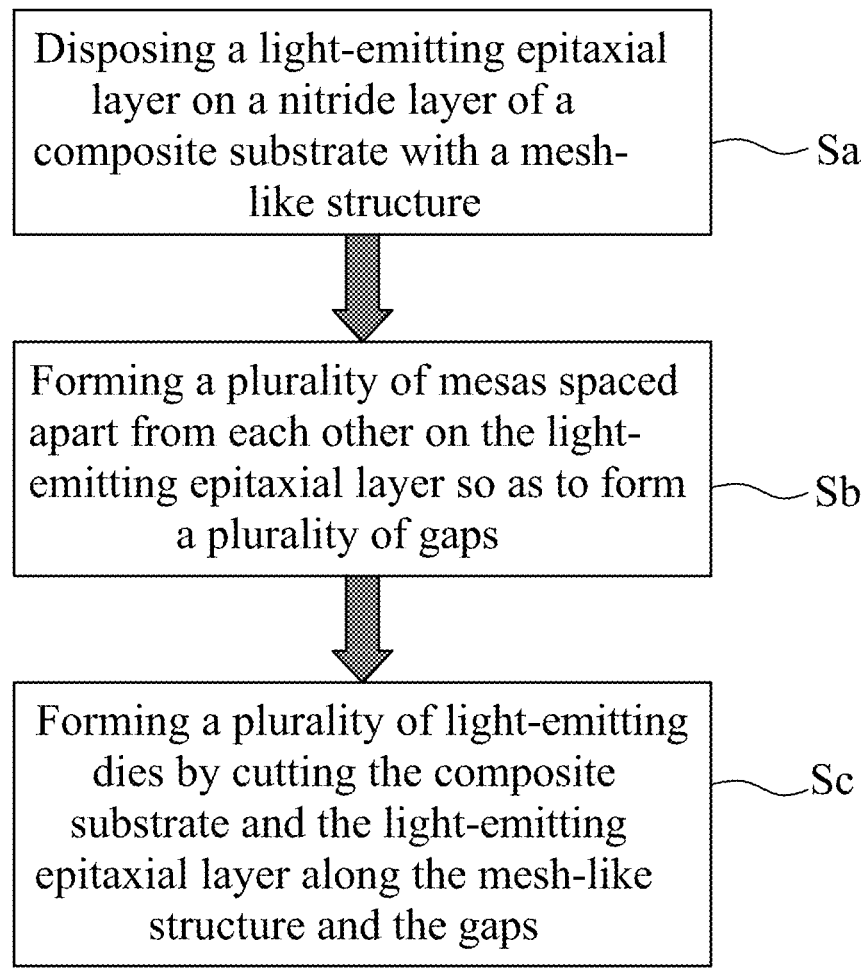
FIG. 2 is a flow diagram illustrating a method for manufacturing a light-emitting device using the composite substrate in accordance with an embodiment of the disclosure.

Referring to FIG. 2, a method for manufacturing a light-emitting device in accordance with an embodiment of the disclosure at least includes steps Sa, Sb and Sc.

In step Sa, a light-emitting epitaxial layer is disposed on the nitride layer 140 of the composite substrate as described above. The light-emitting epitaxial layer includes a first semiconductor layer 300, a second semiconductor layer 400 and a multi-quantum-well structure 500 which is disposed between the first semiconductor layer 300 and the second semiconductor layer 400. The light-emitting epitaxial layer is made of one of a gallium nitride-based layer, a gallium arsenide-based layer, a gallium phosphide-based layer, and combinations thereof.

Figure 3:
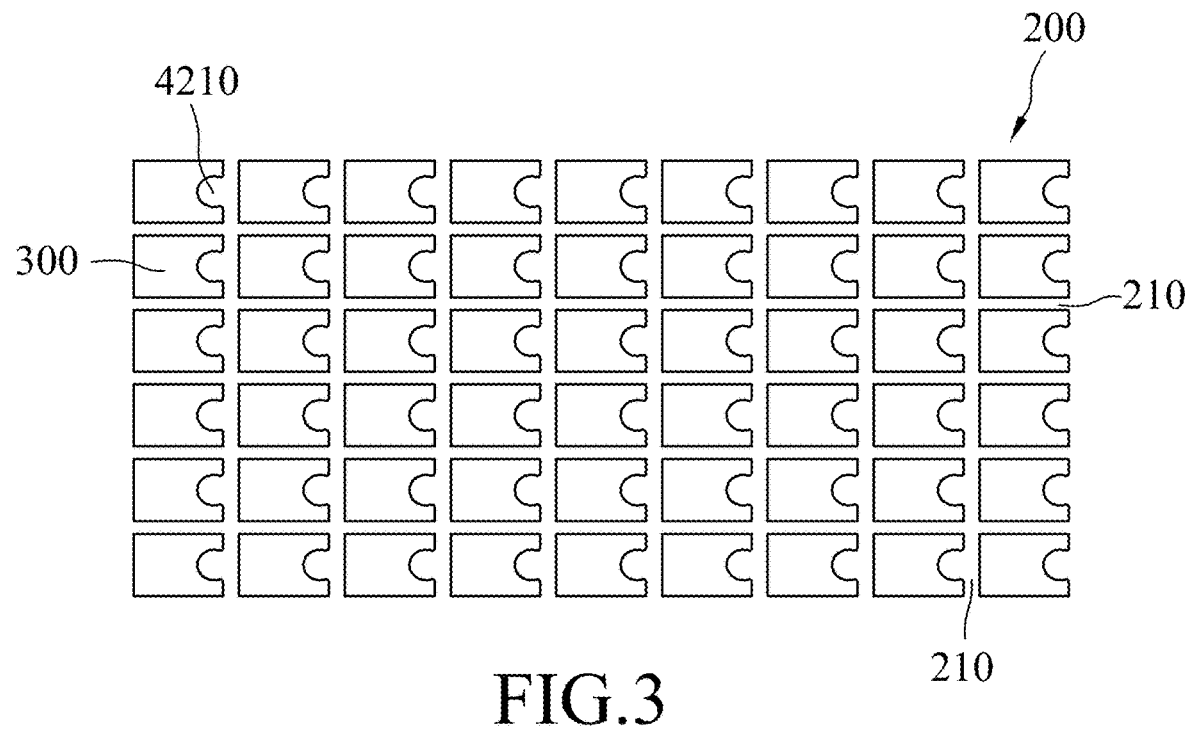
FIG. 3 is a top schematic view illustrating step Sb of forming mesas on a light-emitting epitaxial layer of the method for manufacturing the light-emitting device in accordance with the embodiment of the disclosure.

In step Sb, a plurality of mesas 200 is formed spaced apart from each other on the light-emitting epitaxial layer so as to form a plurality of gaps 210 thereamong. The gaps 210 serve as second pre-cutting channels (as shown in FIG. 3). The mesh-like structure (150) serving as the first pre-cutting channels and the gaps (210) serving as the second pre-cutting channels have the same projected images on the composite substrate.

In step Sc, the composite substrate and the light-emitting epitaxial layer are cut along the mesh-like structure 150 (the first pre-cutting channels) and the gaps 210 (the second pre-cutting channels), so as to form a plurality of light-emitting dies.

In this embodiment, in step Sb, the formation of the mesas 200 further includes:
step Sb-1 of disposing a transparent conductive layer 320 on the light-emitting epitaxial layer;
step Sb-2 of forming mesa patterns by applying a photoresist to the transparent conductive layer 320 and then patterning the same;
step Sb-3 of forming a platform 4210 for subsequent electrode deposition by an etching process such as ICP etching; and
step Sb-4 of removing the photoresist so as to form the mesas 200 having defined p-n junction patterns.

Figure 4:
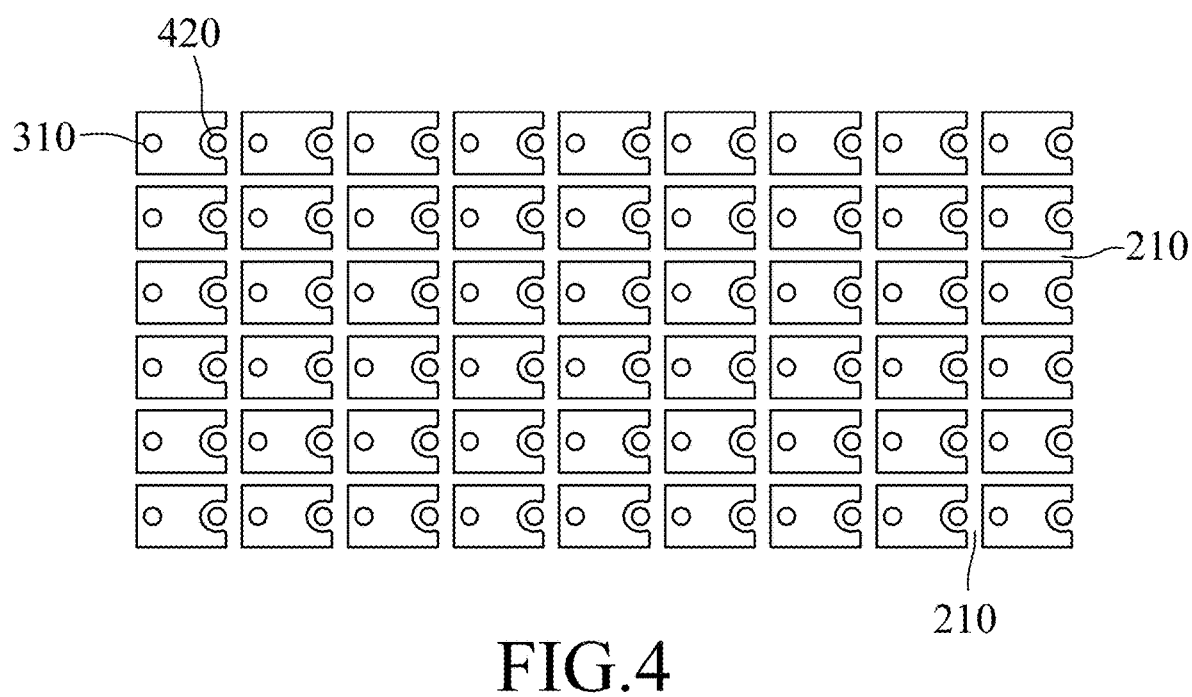
FIG. 4 is a top schematic view illustrating steps Sc-1 and Sc-2 of forming first and second electrodes of the method for manufacturing the light-emitting device in accordance with the embodiment of the disclosure.
Figure 5:
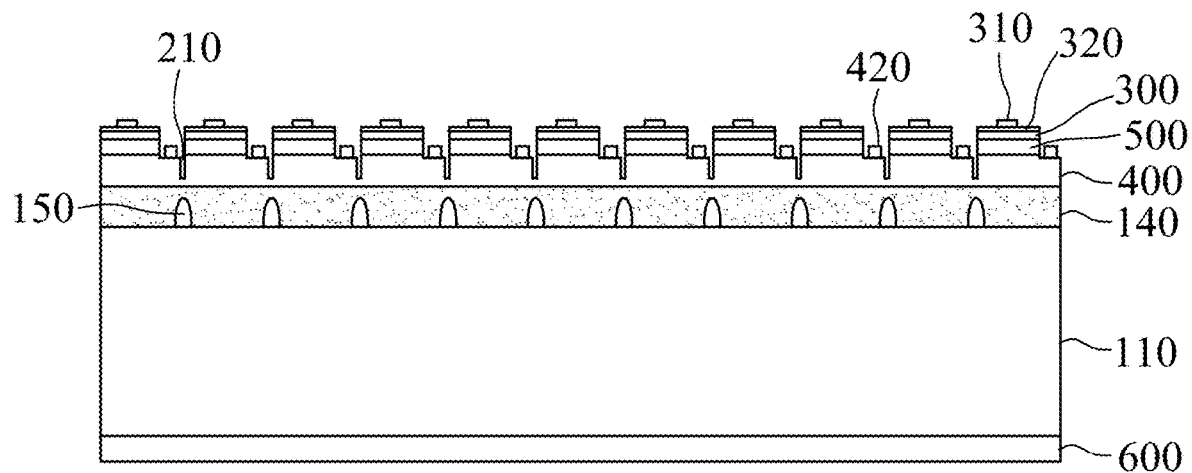
FIG. 5 is a cross-sectional schematic view illustrating step Sc-4 of disposing a DBR (distributed Bragg reflector) layer on the composite substrate of the method for manufacturing the light-emitting device in accordance with the embodiment of the disclosure.
Figure 6:
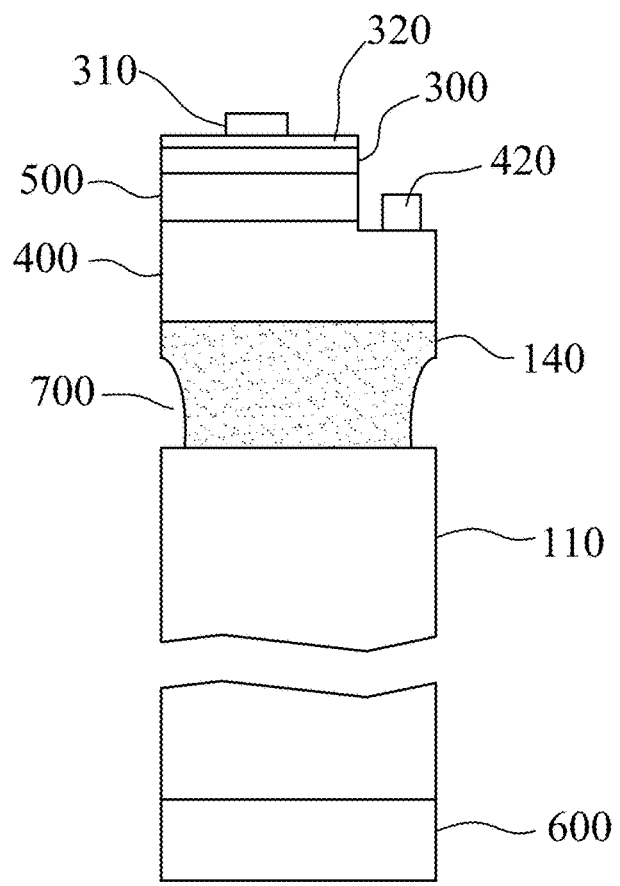
FIG. 6 is a schematic view of the light-emitting device formed by the method for manufacturing the light-emitting device in accordance with the embodiment of the disclosure.

In this embodiment, in step Sc, the formation of the light-emitting dies further includes:
step Sc-1 of disposing a first electrode 310 on the first semiconductor layer 300 (as shown in FIG. 4);
step Sc-2 of disposing a second electrode 420 on the second semiconductor layer 400 (as shown in FIG. 4);
step Sc-3 of thinning a backside of the composite substrate opposite to the light-emitting epitaxial layer;
step Sc-4 of disposing a DBR (distributed Bragg reflector) layer 600 on the backside of the composite substrate (as shown in FIG. 5);
step Sc-5 of implementing a wafer dicing process, such as stealth dicing, on a lower surface of the composite substrate opposite to the light-emitting epitaxial layer along the mesh-like structure 150 (the first pre-cutting channels); and
step Sc-6 of forming the light-emitting dies by implementing a wafer cleaving process along the gaps 210 (the second pre-cutting channels) (as shown in FIG. 6).

In some embodiments, in step Sc-1, the first electrode 310 is disposed on the transparent conductive layer 320.

Referring to FIG. 6, light-emitting devices manufactured by the abovementioned method of the disclosure, i.e., the light-emitting dies thus formed, includes: the substrate 110; the nitride layer 140, the second semiconductor layer 400, the multi-quantum-well structure 500 and the first semiconductor layer 300 which are sequentially disposed on the substrate 110 in such order; the first electrode 310 disposed on the first semiconductor layer 300; the second electrode 420 disposed on the second semiconductor layer 400; and a depressed area 700 formed in a boundary region between the nitride layer 140 and the substrate 110. In some embodiments, the light-emitting dies further include the DBR (distributed Bragg reflector) layer 600 disposed on the backside of the substrate 110 and the transparent conductive layer 320 disposed on the first semiconductor layer 300.

The depressed area 700 not only enlarges a sidewall area for emitting light but also varies a direction or an angle for emitting light, bringing about improvements in light-emitting efficiency of the light-emitting devices.

In summary, the composite substrate of this disclosure, which has the mesh-like structure 150 with the specific patterns, preferably the crisscross pattern, is manufactured by disposing the mesh-like dummy metallic layer 130 on the substrate 110 and then disposing the nitride layer 140 at a temperature higher than the removal temperature of the dummy metallic layer 130.

Further, the light-emitting epitaxial layer is disposed on the composite substrate, and the mesas 200 are formed on the light-emitting epitaxial layer. During the wafer dicing process performed by focusing a laser beam on an interior of the wafer from the backside of the composite substrate along the gaps 210 among the mesas 200 on the light-emitting epitaxial layer (the second pre-cutting channels), an introduction of the mesh-like structure 150 (the first pre-cutting channels) can prevent the boundary region of the light-emitting epitaxial layer from being damaged due to an overload of laser energy, which effectively reduces current leakage in the light-emitting devices and extends lifetime of the light-emitting devices.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within broadest the spirit and scope of the interpretation so as to encompass all such modifications and equivalent arrangements.

What is claimed is:

1. A method for manufacturing a composite substrate, comprising:
disposing a mask layer on an upper surface of a substrate;
forming a plurality of mask patterns spaced apart from each other to form a plurality of intervals thereamong;
filling a dummy metallic material into the intervals;
removing the mask patterns to form a mesh-like dummy metallic layer; and
removing the dummy metallic layer while depositing a nitride layer so as to form a mesh-like structure confined by the nitride layer and the substrate.

2. The method according to claim 1, wherein the nitride layer is deposited at a temperature higher than a removal temperature of the dummy metallic layer.

3. The method according to claim 1, wherein the intervals has a width ranging from 14 μm to 28 μm.

4. The method according to claim 1, wherein the dummy metallic material is selected from magnesium, sodium, zinc or magnesium nitride.

5. The method according to claim 1, wherein the dummy metallic layer has a thickness ranging from 3 μm to 5 μm.

6. The method according to claim 1, wherein deposition of the nitride layer is carried out by one of metal-organic chemical vapor deposition, physical vapor deposition and plasma-enhanced chemical vapor deposition techniques.

7. The method according to claim 1, wherein the nitride layer is made of a group IIIA nitride material.

8. The method according to claim 7, wherein the group IIIA nitride material is selected from the group consisting of gallium nitride, aluminum nitride, aluminum gallium nitride and combinations thereof.

9. A method for manufacturing a light-emitting device, comprising:
disposing a light-emitting epitaxial layer on a composite substrate, the composite substrate including
a substrate,
a nitride layer disposed on the substrate, and
a mesh-like structure confined by the nitride layer and the substrate, the mesh-like structure dividing the substrate into a plurality of regions, the light-emitting epitaxial layer being disposed on the nitride layer and including
a first semiconductor layer,
a second semiconductor layer, and
a multi-quantum-well structure which is disposed between the first semiconductor layer and the second semiconductor layer;
forming a plurality of mesas spaced apart from each other on the light-emitting epitaxial layer so as to form a plurality of gaps thereamong; and
forming a plurality of light-emitting dies by cutting the composite substrate and the light-emitting epitaxial layer along the mesh-like structure and the gaps,
wherein the formation of the mesas further includes:
disposing a transparent conductive layer on the light-emitting epitaxial layer;
forming mesa patterns by applying a photoresist to the transparent conductive layer and then patterning the same;
forming a platform for subsequent electrode deposition by an etching process; and
removing the photoresist so as to form the mesas having defined p-n junction patterns.

10. The method according to claim 9, wherein the formation of the light-emitting dies further includes:
disposing a first electrode on the first semiconductor layer;
disposing a second electrode on the second semiconductor layer;
implementing a wafer dicing process on a lower surface of the composite substrate opposite to the light-emitting epitaxial layer along the mesh-like hollow structure; and
forming the light-emitting dies by implementing a wafer cleaving process along the gaps.

11. The method according to claim 10, wherein the wafer dicing process includes stealth dicing.

12. The method according to claim 9, wherein the mesh-like structure and the gaps have same projected images on the composite substrate.

13. The method according to claim 9, wherein the etching process includes ICP etching.

14. The method according to claim 9, wherein the light-emitting epitaxial layer includes one of a gallium nitride-based layer, a gallium arsenide-based layer, a gallium phosphide-based layer, and combinations thereof.

* * * * *